United States Patent [19]

Flint

[11] 4,315,705
[45] Feb. 16, 1982

[54] APPARATUS FOR HANDLING AND TREATING WAFERS

[75] Inventor: Alan G. Flint, Los Gatos, Calif.

[73] Assignee: GCA Corporation, Bedford, Mass.

[21] Appl. No.: 779,075

[22] Filed: Mar. 18, 1977

[51] Int. Cl.³ .............................................. B65G 51/02
[52] U.S. Cl. ....................................... 406/73; 406/72; 406/88; 118/50; 118/52; 118/54; 198/339; 198/344
[58] Field of Search ..................... 118/320, 50, 52, 54; 302/2 R, ; 198/339, 344; 406/72, 73, 88

[56] References Cited

U.S. PATENT DOCUMENTS

| 3,645,581 | 2/1972 | Lasch, Jr. et al. | 302/2 R |
| 3,947,236 | 3/1976 | Lasch, Jr. | 302/2 R X |
| 4,030,622 | 6/1977 | Brooks et al. | 198/339 X |

*Primary Examiner*—Robert Mackey
*Attorney, Agent, or Firm*—Flehr, Hohbach, Test, Albritton & Herbert

[57] ABSTRACT

A wafer processing system for spin processing photoresist liquid on a silicon wafer and automatically sequencing them through the processor includes a shuttle having upper and lower air bearing slides. The upper slide receives the wafer from a supply magazine and centers it on a rotating chuck and the lower slide of the shuttle receives the wafer from the chuck and allows it to be transferred to a receive track.

5 Claims, 11 Drawing Figures

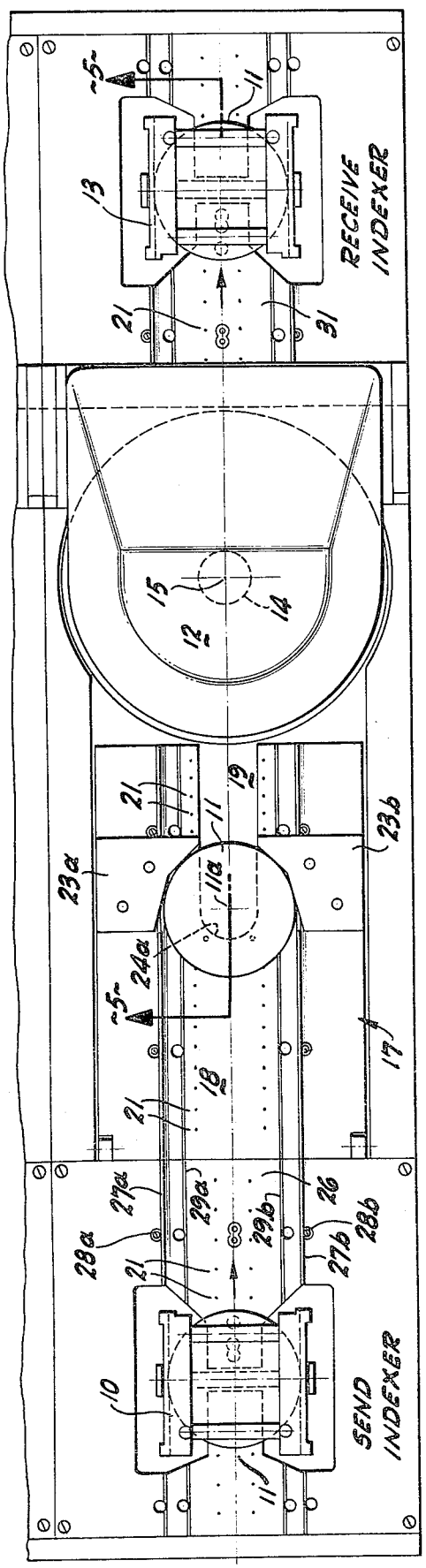
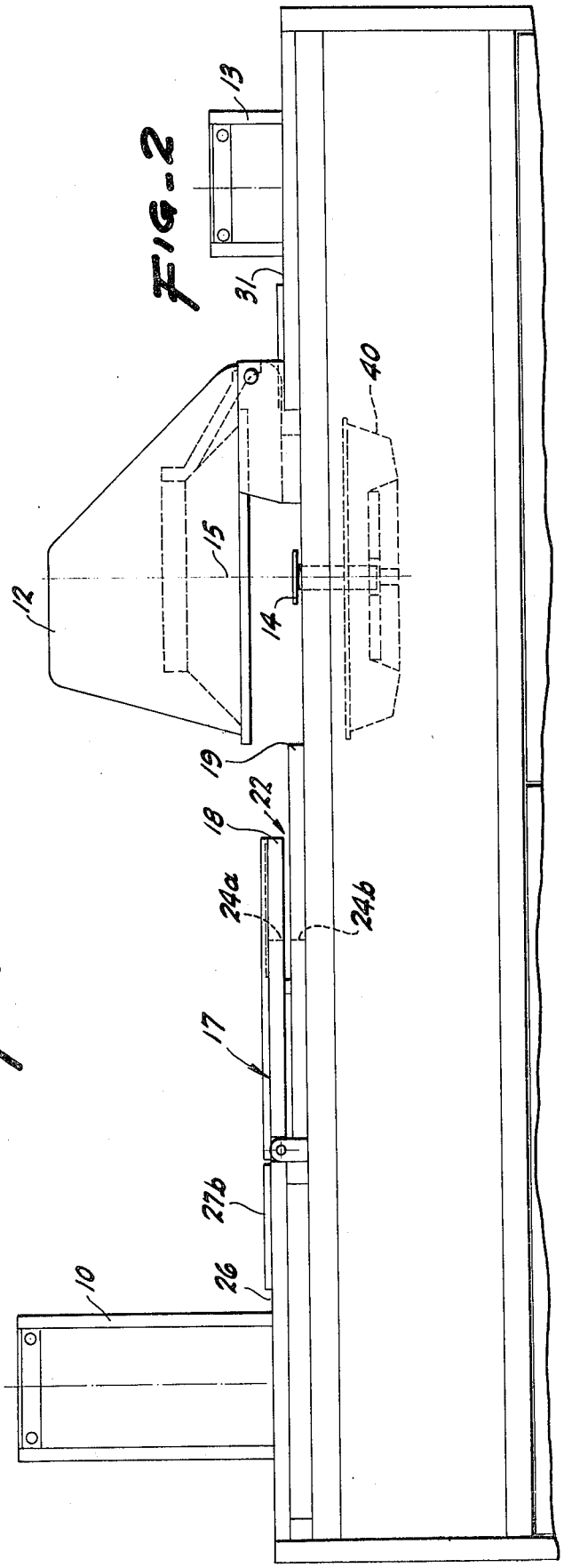

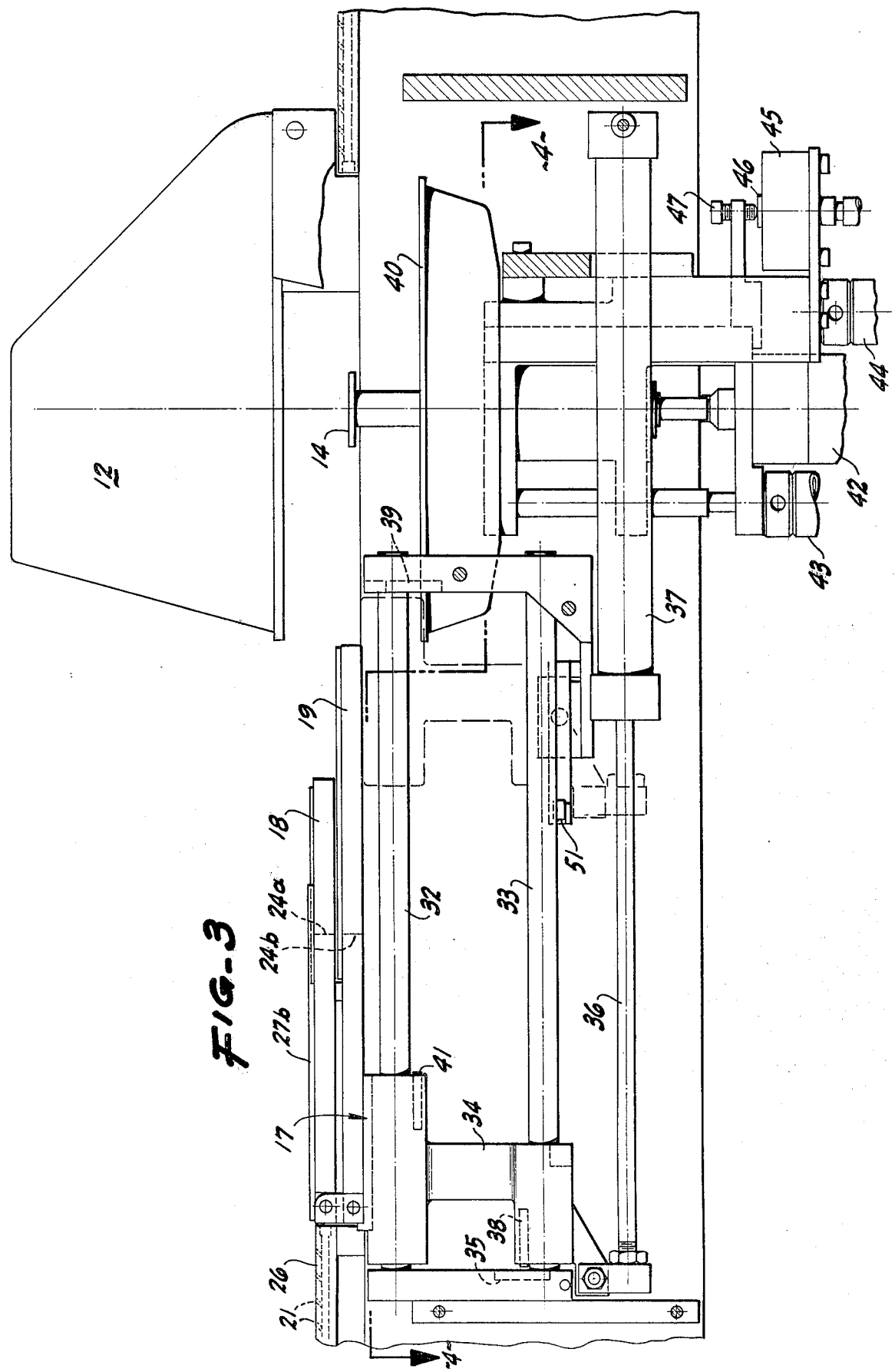

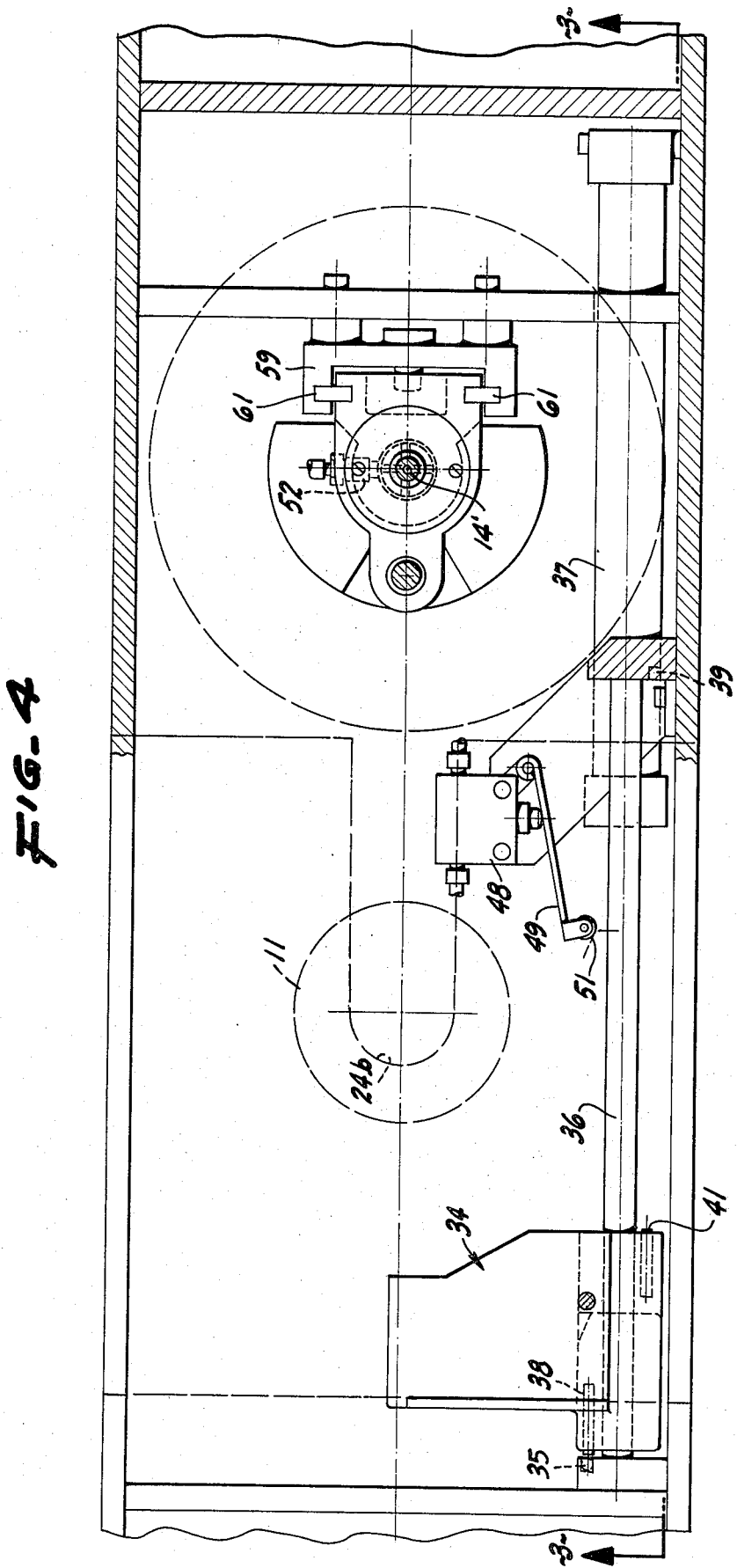

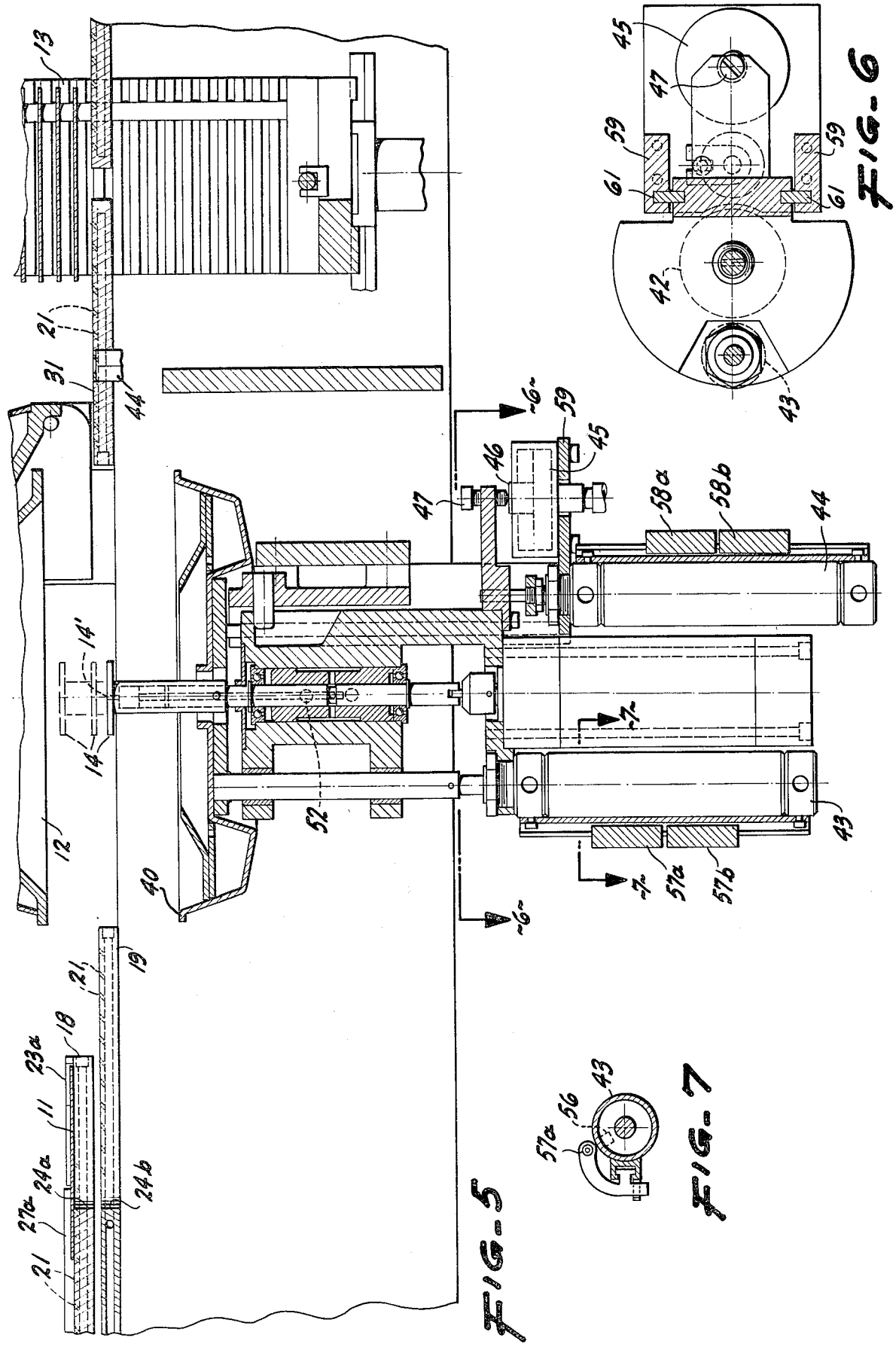

APPARATUS FOR HANDLING AND TREATING WAFERS

BACKGROUND OF THE INVENTION

The present invention is directed to a wafer processing system and method therefor and more specifically to a system where photoresist is deposited on a spinning silicon wafer which will be used in the manufacture of integrated circuits. A typical system which has been used in the past is shown in U.S. Pat. No. 3,645,581 entitled "Apparatus and Method for Handling Articles" with Lasch et al as inventors and assigned to the present assignee. This patent discloses transfer means in the form of vacuum arms for transferring wafers from a supply magazine to a spin processor and then to a discharge magazine.

A known modification of the technique shown in the patent is instead of the use of a transfer arm, a moving shuttle is utilized between the send or supply magazine and the spin processor. This was, in fact, a prior product of the assignee.

While both of the foregoing techniques are satisfactory, adapting such techniques to relatively large diameter silicon wafers, of for example, five inches, requires the overall length of the entire handling system to be increased. This is difficult especially with sicilcon wafer processing systems which are located in clean rooms with enclosures where space is limited; in other words, where a handling system is being reinforced to handle larger sized silicon wafers, such retrofitting from a practical standpoint must be accomplished in the same space as formerly used for smaller wafer size handling equipment.

Thus, there is a need for a compact, automatic spin processor which sequentially handles relatively large size silicon wafers in a compact space but yet with a fast throughput or transfer time.

OBJECTS AND SUMMARY OF THE INVENTION

It is, therefore, an object of the present invention to provide an improved apparatus and method for handling and treating articles such as silicon wafers.

It is another object of the invention to provide a system as above which is compact especially when handling larger size diameter wafers and has a fast throughput.

In accordance with the above object, there is provided a wafer processing system which includes a processor for treating wafers which are automatically sequenced through the processor. The processor has means for retaining each of the wafers during treatment. A shuttle with back and forth movement has an upper slide and a lower slide, the upper slide being spaced from the top of the lower slide a parallel distance greater than a wafer thickness. The upper slide has wafer positioning means for locating a wafer on the retaining means. Send track means supply wafers to the processor and receive track means receive the treated wafers. The send track means are coplanar with the top of the upper slide and the receive track means coplanar with the top of the lower slide. The shuttle may be moved to place the upper slide in close proximity to the send track means, to place the lower slide in close proximity to the receive track means, and to position a wafer on the upper slide in proximity to the retaining means. The retaining means is moved, in a direction perpendicular to the shuttle movement, to up, down and strip positions where the up position is above the top of the upper slide, the down position is substantially even with the parallel space between slides and the strip position is below the top of the lower slide.

From a method standpoint, there is provided a method for sequencing wafers through a spin processor having a rotatable chuck and having send and receive track means and a shuttle with upper and lower slides with a parallel space between such slides greater than a wafer thickness. First the shuttle is retracted to receive a wafer from the send track means on the upper slide and then advanced to center the wafer over the chuck. The chuck is moved up to pick up the wafer from the upper slide. Then the shuttle is retracted to allow processing of the wafer on the chuck and to receive another wafer on the upper slide from the send track means. The chuck is then moved down to locate the picked up processed wafer on a level even with the parallel space between the slides. The shuttle is then advanced to center the wafer on the upper slide over the chuck and concurrently the chuck is lowered to strip the processed wafer from the chuck and place the processed wafer on the lower slide. The wafer is moved from the lower slide to the receive track means. Finally the chuck is moved up to pick up the next wafer from the upper slide to start another cycle of operation.

BRIEF DESCRIPTION OF THE DRAWINGS

FIG. 1 is a plan view of the apparatus embodying the present invention;

FIG. 2 is a side view of FIG. 1;

FIG. 3 is an enlarged cross-sectional view of a portion of FIG. 2;

FIG. 4 is a cross-sectional view taken along the line 4—4 of FIG. 3;

FIG. 5 is a cross-sectional view taken along the line 5—5 of FIG. 1;

FIG. 6 is a cross-sectional view taken along the line 6—6 of FIG. 5;

FIG. 7 is a cross-sectional view taken along the line 7—7 of FIG. 5; and

DETAILED DESCRIPTION OF THE PREFERRED EMBODIMENT

Figure 8A:
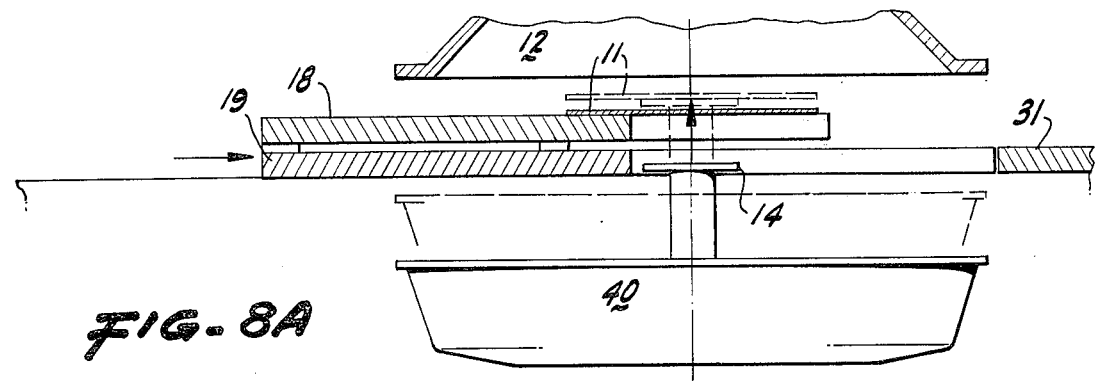
FIGS. 8A–D illustrate different operational positions of the apparatus embodying the present invention and also illustrate the method of the present invention.

Referring now to FIGS. 1 and 2, a send indexer or magazine 10 holds a stack of wafers 11 which are to be processed or treated by a spin processor 12. In such processor, photoresist is dispensed onto the spinning wafer. The wafer is automatically sequenced to a receive indexer or magazine 13. Such indexers or magazines are shown in greater detail in the Lasch patent.

Spin processor 12 includes a rotatable chuck 14 with a center axis 15 which is movable or elevatable in the direction of its axis 15. It retains a circular wafer 11 by vacuum tube down its axis (not shown). Processor 12 could, of course, take many other forms for subjecting the wafers to different types of treatment. This chuck 14 in its broadest context is merely a means for retaining the wafers.

Wafer 11 has a center 11a which must ultimately be centered on axis 15 for proper spinning. A shuttle unit 17 has a back and forth movement between the send indexer 10, where it is positioned as illustrated in FIGS.

1 and 2, to move wafer 11 which is retained on the shuttle, where its center 11a is centered over axis 15 on the chuck, and finally as will be explained below to transport or transfer the wafer ultimately to receive indexer 13.

To accomplish the foregoing, the shuttle 17 includes an upper slide 18 and a lower slide 19 along which the wafers 11 move by means of air bearings, well-known in the art which are illustrated by the air holes 21. Upper slide 18 is spaced from lower slide 19 a parallel distance shown at 22 which is greater than a wafer thickness. The upper slide 18 also includes a pair of plastic stopping blocks 23a, 23b which accurately position the wafer 11 so that when the shuttle 17 is moved into the processor 12, the wafer will be accurately centered on the rotating chuck. In other words, the air bearings 21 move wafer 11 along the slide 18 into contact with the walls of stops 23a, 23b. Each slide 18 and 19 has a U-shaped end 24a, 24b shown in dashed outline which accommodate chuck 14 when the shuttle is moved into the processor 12.

To couple send indexer 10 to the upper slide 18, there is a send track 26 with the proper air bearings 21 which is coplanar with the top surface of upper slide 18. Wafer 11 is guided by vertical flexible plastic guides 27a, 27b which are retained in slots in the send track and slides by screws 28a, 28b as illustrated on both send track 26 and slide 18. There are also blank slots 29a, 29b which may be used for smaller diameter wafers. In a copending application filed Mar. 18, 1977, Ser. No. 779,074, in the names of Loveless et al, and assigned to the present assignee, there are disclosed and claimed novel aspects of such plastic guides.

Receive indexer 13 is connected to the shuttle 17 by a receive track 31 having air bearings 21 with the surface of the track 31 being coplanar with the top of lower slide 19 as best illustrated in FIG. 2.

To briefly summarize the operation, the send indexer 10 contains a stack of silicon wafers to be processed. It operates on a last-in-first-out basis and when filled is in an upper position as shown in FIG. 2. A central unit such as a minicomputer or microprocessor activates the air bearings included in the send indexer (as shown in greater detail in the above Lasch patent) and moves a wafer 11 over send track 26 onto upper slide 18, which has been moved in close proximity, until the wafer 11 rests against the stops 23a, 23b. Shuttle 17 moves the wafer until it is centered upon the chuck, the chuck picks up the wafer and it is processed or treated by dispensing photoresist on it while the chuck is spinning. Thereafter, the wafer is lowered to be placed on lower slide 19 which is also in proximity to receive track 31 and the wafer is finally stored in receive indexer 13.

By the use of the two level system, linear space is saved and transfer time improved. This will be discussed in greater detail in conjunction with FIGS. 8A–D.

Operation of shuttle 17 with its back and forth movement is fully illustrated in the cross-sectional view of FIG. 3 where shuttle 17 moves on a pair of horizontal rods 32 and 33. Specifically, the upper slide 18 and the lower slide 19 are supported by a carriage 34 which is slidable on rods 32 and 33. The shuttle is actuated by a piston 36 connected to carriage 34 and driven by an air cylinder 37. As shown in FIG. 3, slide 18 is in close proximity or in abutment to send track 26 where the air bearing holes are clearly shown pointed in a direction to force the wafer onto the top of slide 18. This position of shuttle 17 is sensed by a reed switch indicated in dashed outline 35 on the fixed frame of the apparatus which is actuated by a permanent magnet 38 located on carriage 34. Similarly, a fixed reed switch 39, shown in dashed outline, is actuated by a permanent magnet 41 on carriage 34 when the shuttle 17 is moved to its other extreme position.

Spin processor 12 is shown in slightly more detail where chuck 14 is rotated by a spin motor 42. A cup 40 is centered on chuck 14 and is movable in a well-known manner upwardly to cover the wafer while the photoresist liquid is being dispensed on it. A piston 43 moves this cup exclusively. On the other hand, a piston 44 moves both the cup 43 and the chuck 14 simultaneously. Finally, a pancake cylinder 45 having a piston 46, when actuated, lowers the guide bolt 47 to move chuck 14 and cup 40 down slightly to a "strip" position as will be discussed below.

Referring now to FIG. 4 which is a cross-sectional view of FIG. 3, the pancake cylinder 45 of FIG. 3 is actually actuated by an air valve 48 having a lever 49 and a cam roller 51. Movement of carriage 34 to the right actuates cam roller 51 as illustrated in dashed outline in FIG. 3. From a timing standpoint, valve 48 is actuated slightly earlier than the reed switch 39 which is actuated when the magnet 41 and carriage 34 reach the end of their travel.

Referring now specifically to FIG. 4, the spinning unit 12 includes a vacuum inlet 52 which through a center hole 14' extending to the top of chuck 14 provides a vacuum to retain a wafer on the chuck.

Greater details of apparatus for moving both the cup 40 and the chuck 14 to up, down and strip positions are shown in FIG. 5 where again the cylinder 43 elevates only the cup, the cylinder 44 moves the chuck along with the cup to up and down positions, and the pancake cylinder 45 moves the cup and chuck to a retracted or strip position.

FIG. 7 illustrates a typical sensing device on cylinder 43 to sense the cup up position where a magnet 56 moving with the piston 43 is sensed by a reed switch 57a; down is sensed by reed switch 57b. Similar reed switches 58a, 58b are on piston 44.

In FIG. 6, which is a cross-sectional view illustrating the construction of the actuating system for the cup 40 and the chuck 14, the fixed frame of the system is illustrated at 59 with the various moving parts being elevated on the vertical guides 61.

Figure 8B:
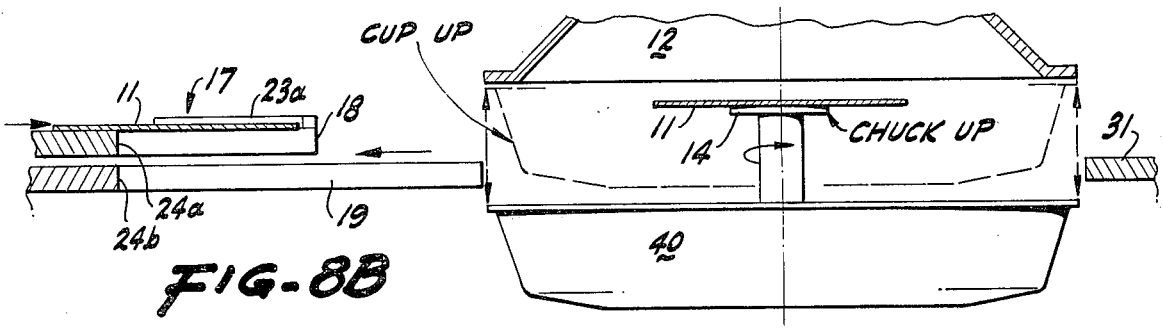

Operation of the invention is best explained in conjunction with FIGS. 8A through 8D. Initially, the shuttle 17 is retracted to receive a wafer from the send track onto the top of the upper slide 18 as illustrated in FIG. 8B. A wafer 11 is shown in contact with the plastic stops 23a, 23b. Such retraction of shuttle 17 allows the chuck 14 to be moved to its up position with another wafer 11 retained on it and liquid is dispensed from spin processor 12 (nozzle not shown). The cup 40 is in an up position to prevent liquid from escaping the processing area. Thus, while one wafer 11 is being processed, another is being collected on upper slide 18 to thus improve transfer time.

Figure 8C:
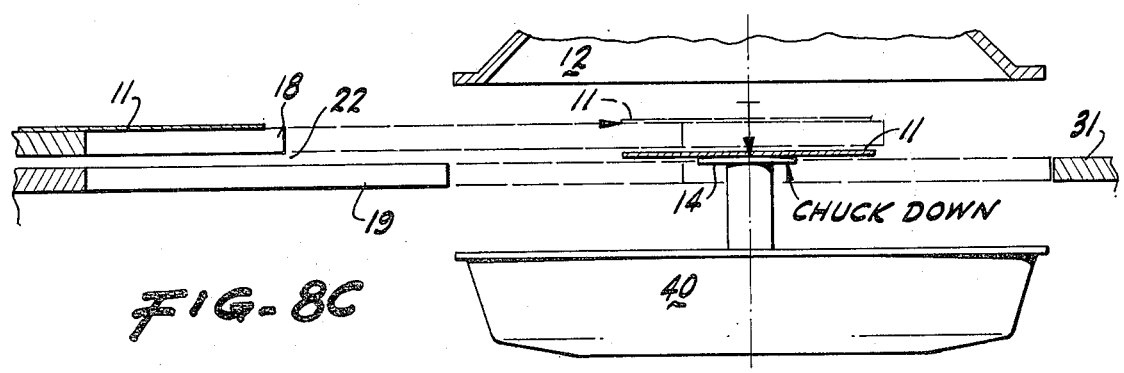

After processing or treatment as illustrated in FIG. 8C, chuck 14 is moved to its down position which locates the processed wafer 11 on a level even with the parallel space 22 between upper slide 18 and lower slide 19. Thus, when the shuttle is advanced as shown in phantom in FIG. 8C, wafer 11 can be accommodated. Advancing of the shuttle centers the wafer 11, which is on the upper slide 18, over chuck 14 as illustrated in phantom and in solid in FIG. 8D. There chuck 14 has been moved from the chuck down position to the strip wafer position which places the processed wafer on the top of the bottom slide 19. The strip wafer position is accomplished by actuating the pancake cylinder 45 of FIG. 5 and chuck 14 is shown in that position in FIG. 5 along with the chuck down and chuck up positions in phantom. In addition, since the pancake cylinder 45 actuates both the cup 40 and the chuck 14, the cup 40 is moved the distance 62 as illustrated in FIG. 8D which is the same distance as chuck 14 is moved from the chuck down to the strip wafer position.

While the processed wafer 11 is on the top of the bottom slide 19, the slide 19 is also in close proximity to receive track 31. Actuation of the air bearings by central control means moves the wafer from the bottom slide to the receive track. Thereafter, the chuck 14 can immediately pick up the other wafer on slide 18 as illustrated in FIG. 8A and move it to the chuck up or processing position as shown in FIG. 8B. Thus, one cycle of the control sequence has been illustrated.

Figure 8D:
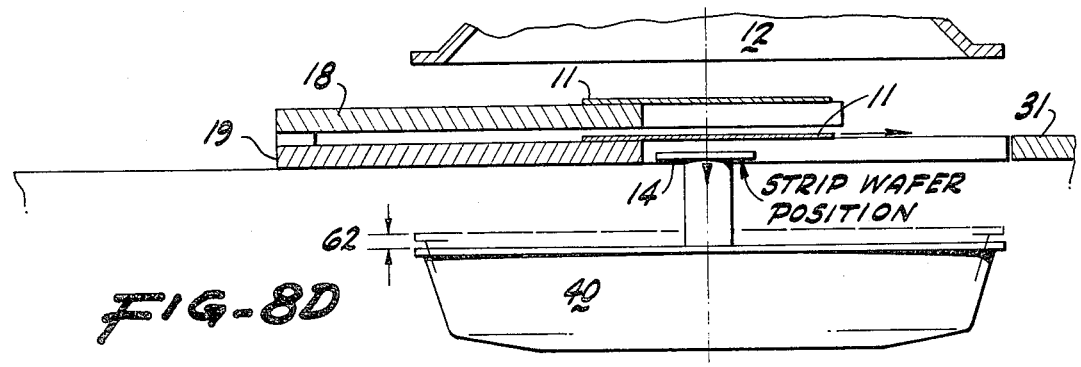

In summary, the foregoing two level technique allows a relatively large diameter wafer, such as five inches, to be processed in a very limited linear space since as illustrated in FIG. 8D during the transfer, the wafers are in effect stacked one above the other. In contrast, in the prior art wafers were on the same level adjacent each other. In addition, a concomitant result of the stacking technique is the increase in transfer time from the supply magazine or indexer to the receive indexer.

Also, rather than using magazines or indexers, the system of the present invention is readily useable in a complex wafer processing system involving multiple bake ovens and different types of treatment devices other than spin processors as disclosed in the above copending application.

I claim:
1. A wafer processing system including a processor for treating wafers which are automatically sequenced through said processor said processor having means for retaining each of said wafers during treatment said system comprising: a shuttle with back and forth movement having an upper slide and a lower slide the upper slide being spaced from the top of the lower slide a parallel distance greater than a wafer thickness, said upper slide having wafer positioning means for locating a wafer on said retaining means; send track means for supplying wafers to said processor and receive track means for receiving treated wafers, said send track means being coplanar with the top of said upper slide and said receive track means coplanar with the top of said lower slide; means for moving said shuttle to place said upper slide in close proximity to said send track means, to place said lower slide in close proximity to said receive track means, and to position a wafer on said upper slide in proximity to said retaining means; and means for moving said retaining means in a direction perpendicular to said shuttle movement, to up, down and strip positions where said up position is above the top of said upper slide, the down position is substantially even with said parallel space between slides and said strip position is below the top of said lower slide.

2. A system as in claim 1 where said wafer on said upper slide is located over said retaining means concurrently with said lower slide being in close proximity to said receive track means.

3. A system as in claim 1 where said slides include air bearing means.

4. A system as in claim 1 where said slides include U-shaped ends to accommodate said retaining means.

5. A system as in claim 1 where said retaining means is a rotatable chuck and said wafers are centered on said rotating chuck.

* * * * *